United States Patent
Shimada

(10) Patent No.: US 6,854,309 B2
(45) Date of Patent: Feb. 15, 2005

(54) GAS-BARRIER SYNTHETIC RESIN VESSEL, DEVICE FOR PRODUCING THE SAME, AND ARTICLE-RECEIVED GAS-BARRIER SYNTHETIC RESIN VESSEL

(75) Inventor: Kiyonori Shimada, Komoro (JP)

(73) Assignee: Nissei ASB Machine Co., Ltd., Komoro (JP)

(*) Notice: Subject to any disclaimer, the term of this patent is extended or adjusted under 35 U.S.C. 154(b) by 36 days.

(21) Appl. No.: 10/312,081

(22) PCT Filed: Apr. 19, 2002

(86) PCT No.: PCT/JP02/03910
§ 371 (c)(1),
(2), (4) Date: Dec. 23, 2002

(87) PCT Pub. No.: WO02/085717
PCT Pub. Date: Oct. 31, 2002

(65) Prior Publication Data
US 2003/0110822 A1 Jun. 19, 2003

(30) Foreign Application Priority Data
Apr. 19, 2001 (JP) .................................. 2001-121251

(51) Int. Cl.[7] .............................................. B21B 45/00
(52) U.S. Cl. ................ 72/46; 72/38; 72/47; 72/715; 413/18; 427/237; 427/249.7
(58) Field of Search .......................... 72/38, 46, 47, 72/715; 413/9, 18, 27; 118/723 R, 723 VE, 723 E, 723 ER; 427/237, 249.7, 577

(56) References Cited

U.S. PATENT DOCUMENTS 5,798,139 A * 8/1998 Nagashima et al. ........ 427/237
6,503,579 B1 * 1/2003 Murakami et al. .......... 427/577
6,589,619 B1 * 7/2003 Nagashima ................ 428/36.6

FOREIGN PATENT DOCUMENTS

| EP | 0 997 554 | 5/2000 |
|----|-----------|--------|
| EP | 1 197 581 | 4/2002 |
| JP | 60-228250 | 11/1985 |
| JP | 2-70059 | 3/1990 |
| JP | 8-053117 | 2/1996 |
| JP | 11-256331 | 9/1999 |
| JP | 2000-43875 | 2/2000 |
| JP | 2001-158976 | 6/2001 |

* cited by examiner

Primary Examiner—Ed Tolan
(74) Attorney, Agent, or Firm—Oblon, Spivak, McClelland, Maier & Neustadt, P.C.

(57) ABSTRACT

A gas barrier synthetic resin container 10 has an opening portion 12 defined by a flange 12A, a body portion 14 having the opening portion 12, and a bottom portion 16 for closing the end of the body portion 14. The container 10 is a wide mouth container having the minimum inside diameter Dmin of the opening portion 12 larger than the maximum inside diameter Dmax of the body portion. Alternatively, the container 10 may be a wide mouth container having the minimum inside diameter Dmin of the opening portion 12 smaller than the maximum inside diameter Dmax of the body portion, the difference between the diameters being equal to or less than 20 mm. A diamond-like carbon film 18 is formed on an outer wall of the body portion 14 and bottom portion 16 of the container 10. After the container 10 has been filled with contents, a metal cover 20 and the flange 12A are double-seamed onto the container to provide improved gas barrier properties to the entire container.

23 Claims, 6 Drawing Sheets

GAS-BARRIER SYNTHETIC RESIN VESSEL, DEVICE FOR PRODUCING THE SAME, AND ARTICLE-RECEIVED GAS-BARRIER SYNTHETIC RESIN VESSEL

This application is a 35 USC 371 of PCT/JP02/03910 filed Apr. 19, 2002 and claims foreign priority from Japanese application 2001-121251 filed Apr. 19, 2001.

TECHNICAL FILED

The present invention relates to a gas barrier synthetic resin container, a machine for making the same and a gas barrier synthetic resin container filled with contents.

BACKGROUND ART

Synthetic resin containers are broadly used as package containers for various things such as drinks. Package containers containing easy-oxidizing contents such as beers must have gas barrier properties.

However, polyethylene terephthalate (PET) bottles which are most broadly utilized as beverage containers could not provide the gas barrier properties required by beers.

To provide the gas barrier properties to the PET bottles, generally, they have been produced to have a multi-layer structure including a PET resin layer and a gas barrier resin layer.

As a recent technique for providing a container with a bas barrier properties, there is a coating technique using chemical vapor deposition (CVD) in place of such a multi-layer structure.

Particularly, a technique referred to as diamond-like carbon (DLC) deposition can provide a package container with largely improved gas barrier properties.

The DLC deposition is disclosed in Japanese Patent No. 2788412, Japanese Patent Laid-Open Application No. Hei 11-256331, Japanese Patent Laid-Open Application No. 2000-43875, or the like. DLC films and their properties are described in detail in Japanese Patent No. 2788412.

Some of these documents disclose containers having their inner walls on which is formed the DLC film, and Japanese Patent Laid-Open Application No. 2000-43875 describes formation of DLC film on an outer container wall, but there is no concrete description relating to a machine for making such a container.

Moreover, consumers often feel uncomfortable when a DLC film is formed on an inner wall of container, especially when it contains a drink.

DISCLOSURE OF THE INVENTION

The present invention may provide a machine for making a gas barrier synthetic resin container suitable for coating a DLC film on an outer container wall, and a gas barrier synthetic resin container and a gas barrier synthetic resin container filled with contents made by such a machine.

In coating a DLC film on an outer container wall, it is essential to provide an inner electrode within the container. When the container is a so-called narrow mouth container, however, the outside diameter of inner electrode is too small relating to the diameter of container body portion, even if the inner electrode could be inserted into the container through its narrow top opening portion, making it impossible to form a substantially uniform DLC film on an outer wall of the container.

A container on which is formed a DLC film according to the present invention are limited to a wide mouth synthetic resin container having an opening portion, a body portion followed by the opening portion, and a bottom portion for closing the end of the body portion, with a small difference between the minimum inside diameter of the opening portion and the maximum inside diameter of the body portion. A diamond-like carbon film is formed on an outer wall of such a container. This wide mouth container includes a container having the minimum inside diameter of the opening portion larger than the maximum inside diameter of the body portion, and a container having the minimum inside diameter of the opening portion smaller than the maximum inside diameter of the body portion with the difference equal to or less than 20 mm.

A machine which makes such a wide mouth container according to one aspect of the present invention comprises:

a base which supports the opening portion;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container; and a plasma excitation portion which generates plasma in the ambient space around the container by using the inner and outer electrodes.

In this aspect of the invention, the outside diameter of the inner electrode inserted into the wide mouth container through the opening portion can be sufficiently large relative to the inside diameter of the container body portion. In this machine, the plasma containing carbon atoms can be formed in the space between the outer wall of the container and the outer electrode, enabling to form a substantially uniform DLC film on the outer wall of the container.

When a DLC film is formed on the inner container wall, the outer electrode must be substantially similar to the external shape of the container, as in Japanese Patent No. 2788412. This raises a problem in that the outer electrode must be machined in a complicated and expensive manner. In the above aspect of the present invention, the shape of the outer electrode is not necessarily similar to the external shape of the container. This overcomes the above-mentioned problem.

The distance between the inner wall of the outer electrode and the outer wall of the body portion may range between 10 mm and 25 mm. This makes it possible to smoothly move the gas in the ambient space around the container and to excite plasma in the ambient space, when the plasma helps formation of a DLC film on the outer container wall.

According to another aspect of the invention, there is provided a gas barrier synthetic resin container made by such a machine to have a diamond like carbon film.

When the container is a wide mouth container having the minimum inside diameter of the opening portion larger than the maximum inside diameter of the body portion, the inner electrode may be substantially in contact with an inner wall of the container.

The inner electrode may have an evacuation section which evacuates air from the space between the inner electrode and an inner wall of the container. This makes it possible to prevent leakage of air or other gases from the space between the inner electrode and the inner container wall.

The machine may further include a gas inlet which introduces the gas from the gas supply device into the ambient space around the container from the side of the opening portion of the container supported on the base. The gas inlet may have a ring shape around the opening portion. This makes it possible to flow the gas uniformly around the container, enabling to make the thickness in the circumferential direction and properties of the film to be formed uniform. In such a case, the outer electrode may have a gas outlet connected to the vacuum pump in a position facing the bottom portion of the container. Moreover, the diameter of the gas outlet may be larger than the difference between the inside and outside diameters of the ring-shaped gas inlet in view of the evacuation conductance.

The machine may further include an enclosing structure forming a gas introduction chamber, disposed at a position upstream from the gas inlet. In such a case, a pre-excitation portion which pre-excites the gas in the gas introduction chamber may be provided. This makes it possible to transform the gas into plasma before it reaches the container opening portion. The pre-excitation portion may be any of various excitation means such as microwave. Alternatively, the pre-excitation portion may be formed of a pair of electrodes, when one of the electrodes is part of the inner electrode externally extending from the container through the opening portion, and the other electrode is one of the outer electrode and the enclosing structure.

The machine may further include a drive which moves the enclosing structure relative to the outer electrode, and also moves the inner electrode relative to the outer electrode through the base, together with the enclosing structure.

The inner electrode may have a support which is disposed within the opening portion and supports the container; and an electrode rod extending upward from the support. In this case, the opening portion may be defined by an outwardly extending thin-walled flange to be used for seaming. To prevent the flange from being coated with the DLC film, an outer surface of the support which supports the flange may be formed of an insulating material.

The container may have a plurality of legs outwardly extending from the bottom portion, and the inner electrode may have a plurality of protrusions each of which is disposed at a position facing the corresponding one of the legs.

According to further aspect of the present invention, there is provided a machine which makes a gas barrier synthetic resin container by forming a film on an outer wall of a synthetic resin container which has an opening portion, a body portion including the opening portion, and a bottom portion for closing the end of the body portion. The container is not limited to a wide mouth container, and may be any one of other containers such as a narrow mouth container.

Such a machine comprises:

a base which supports the container;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container;

a plasma excitation portion which generates plasma in the ambient space around the container by using the inner and outer electrodes; and a ring-shaped gas inlet which introduces the gas from the gas supply device into the ambient space around the container from the side of the opening portion of the container supported on the base.

By providing the ring-shaped gas inlet, the gas can be flown uniformly around the container and a film having uniform properties and thickness in the circumferential direction can be formed. This can also be achieved in any of various containers other than wide- and narrow mouth containers.

A metal cover may be double-seamed with the flange defining the opening portion onto the container. This is because the metal cover can secure the gas barrier properties. In this case, the flange with which the metal cover is double-seamed may be coated with the DLC film or not. This is because the metal cover provides the gas barrier properties. If the DLC film is not formed on the flange, the container can be prevented from being deformed, eliminating any adverse affect which may be provided to the double-seamed portion through the DLC film. If the closing means for the opening portion has no gas barrier properties, like a plastic cap, the DLC film is preferably formed on the flange.

BEST MODE FOR CARRYING OUT THE INVENTION

Several embodiments of the present invention will now be described with reference to the drawings.

First Embodiment
PET Can and PET Can Filled with Beer

Figure 1:
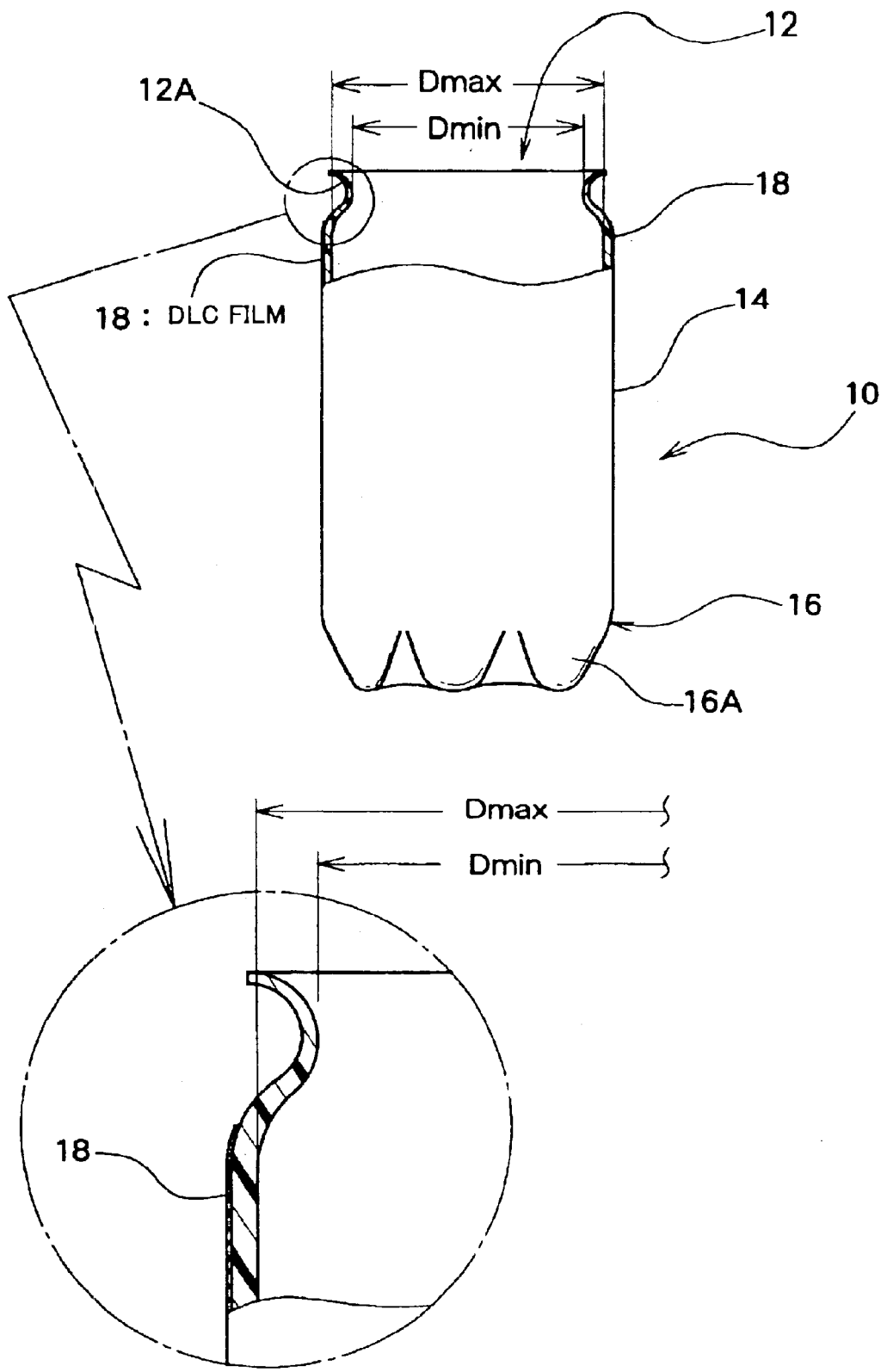
FIG. 1 is a schematic diagram illustrating a container (or PET can) according to one embodiment of the present invention.

FIG. 1 shows a gas barrier synthetic resin container 10 such as PET can. The container 10 has an opening portion 12, a body portion 14 having the opening portion 12 and a bottom portion 16 for closing the end of the body portion 14.

The opening portion 12 is formed with an outwardly extending thin-walled flange 12A. The bottom portion 16 has a self-supporting structure having five legs 16A, for example.

The minimum inside diameter Dmin of the opening portion 12 is smaller than the maximum inside diameter Dmax of the body portion 14. The difference between the minimum inside diameter Dmin of the opening portion 12 and the maximum inside diameter Dmax of the body portion 14 is equal to or smaller than 20 mm. This provides a so-called wide mouth container 10.

Figure 2:
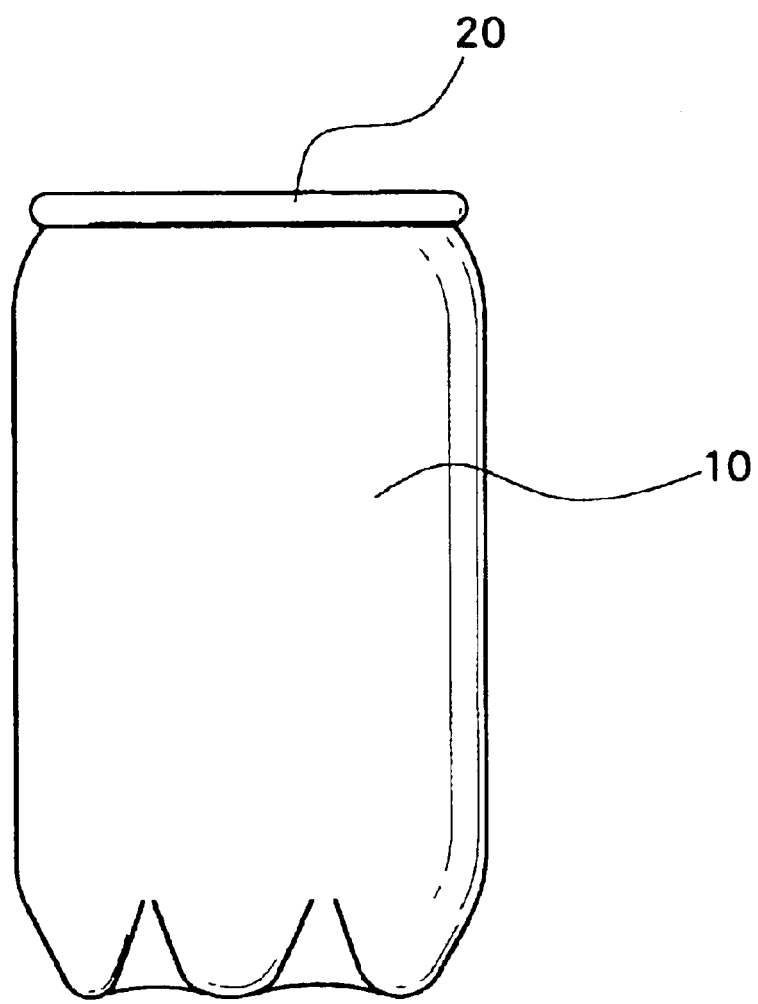
FIG. 2 is a schematic view of a PET beer can provided by filling the container of FIG. 1 with beer before double-seaming it with a metal cover.

FIG. 2 shows a PET beer can 30 provided by filling the container 10 with beer before double-seaming a metal can cover 20 (of aluminum, for example) to the flange 12A.

Referring to FIGS. 1 and 2, a DLC film 18 (see FIG. 1) is formed on the outer walls of the body portion 14 and bottom portion 16 of the container 10, and the flange 12A not coated by the DLC film 18 is double-seamed with the aluminum can cover 20. Thus, the DLC film 18 and aluminum can cover 20 provide gas barrier properties against the filled beer. The flange 12A is thinner than the body portion 14 to be easily seamed. Since the flange 12A is not covered by the DLC film, its flexibility can be maintained.

Machine Structure and Making Method

Figure 3:
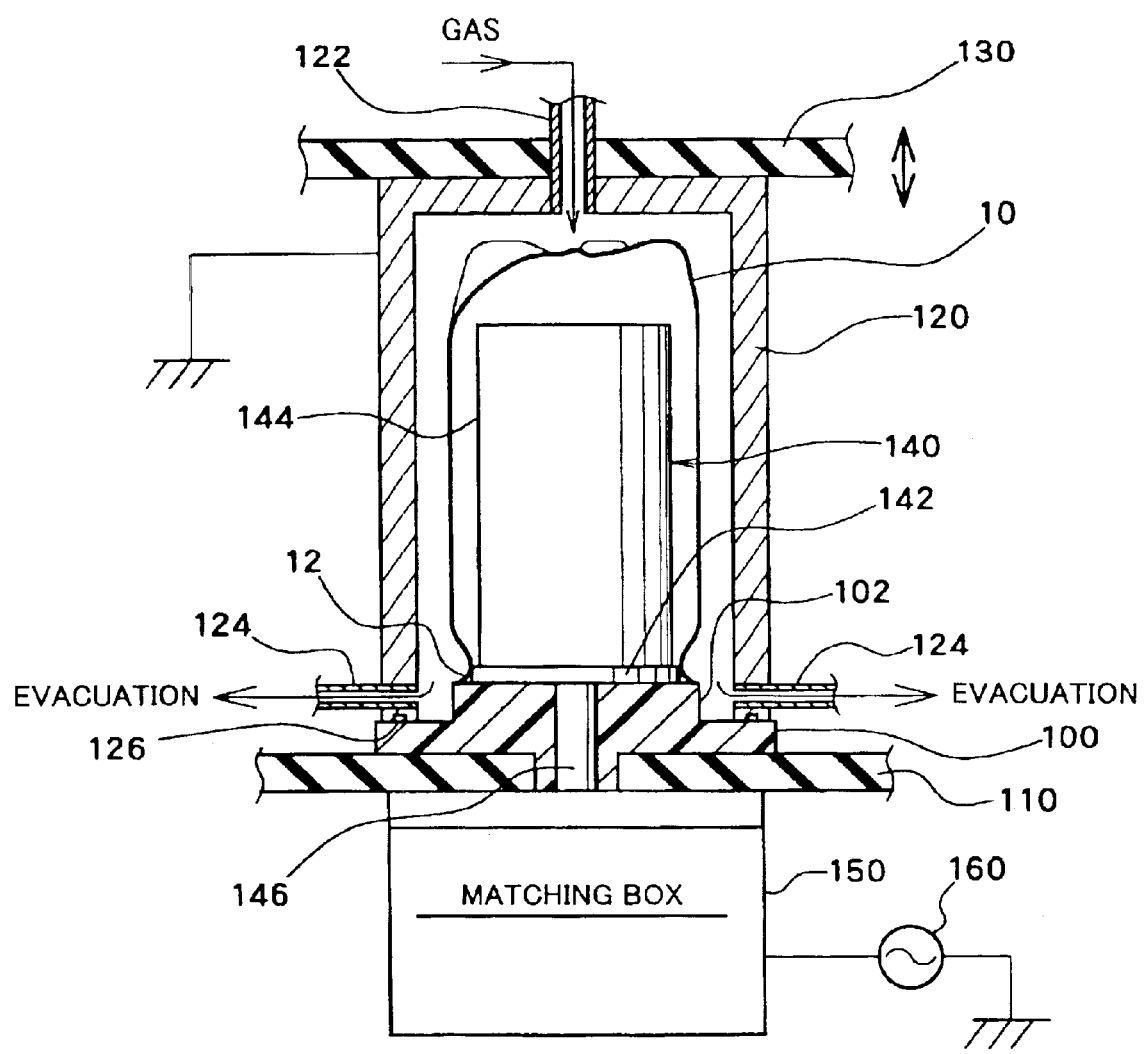
FIG. 3 is a schematic diagram illustrating a machine for making the container of FIG. 1 according to the first embodiment of the present invention.

FIG. 3 illustrates a machine for making the container 10 of FIG. 1. It is to be noted that the cross-section of the container 10 is shown by a thickened line in FIG. 3 (and also in FIG. 4). The machine shown in FIG. 3 generally includes an insulating base 100, a lower stationary plate 110, an external electrode 120, an upper elevating plate 130, an inner electrode 140, a matching box 150 and a high-frequency power source 160.

In FIG. 3, the container 10 is placed upside down on a central step 102 of the insulating base 100. The base 100 is fixedly mounted on the lower stationary plate 110. The cylindrical external electrode 120 can be moved up or down to contact with or separate from the base 100. This external electrode 120 is fixed to the upper elevating plate 130 which can be moved up and down by a drive unit (not shown).

A gas inlet pipe 122 extends through the outer electrode 120 and upper elevating plate 130 at their centers. The gas inlet pipe 122 is connected to a source of one or more gases (not shown), any of gases can be supplied to the interior. A plurality of vacuum pipes 124 are provided on the lower side of the outer electrode 120 in a circumpherential direction. The vacuum pipes 124 are disposed to be lower than the flange 12A on the central step 102 of the base 100. These vacuum pipes 124 are connected to a vacuum pump (not shown). There is also provided a sealing member 126 such as an O-ring for sealing a gap between the outer electrode 120 and the base 100.

The inner electrode 140 is disposed on the central step 102 of the base 100 to be within the container 10. The inner electrode 140 includes: a support 142 which is disposed in the opening portion 12, inside of the flange 12A for supporting the container 10; and an electrode rod 144 extending upward from the support 142 and having its outside diameter smaller than that of the support 142. At least an outer wall of the support 142 may be formed of an insulating material.

The matching box 150 is fixed on a bottom portion surface of the lower stationary plate 110 and electrically connected to the inner electrode 140 through an electrifying shaft 146. The matching box 150 performs impedance matching for the high-frequency power from the high-frequency power source 160 then supplies the power to the inner electrode 140.

In the machine of FIG. 3, the container 10 is placed upside down on the central step 102 of the base 100 with the opening portion 12 directed downward when the outer electrode 120 is upward moved. At this time, the flange 12A of the container 10 may be fitted over the support 142 so that the container 10 can be supported upside down. The electrode rod 144 of the inner electrode 140 is disposed within the container 10 without contacting the inner wall of the container 10. Alternatively, the container 10 may be placed on the base 100 in its erecting position as shown by inverting FIG. 3.

Thereafter, the outer electrode 120 is moved downward with the upper elevating plate 130 to bring the sealing member 126 at the bottom portion edge of the outer electrode 120 into intimate contact with the top of the base 100.

Thus, the space around the container 10 is hermetically sealed between the base 100 and the outer electrode 120. Incidentally, the cylindrical external electrode 120 has its inside diameter 20 to 50 mm larger than the outside diameter of the body portion 14. Therefore, the space between the body portion 14 of the container 10 and the inner wall of the outer electrode 120 has its thickness of 10 to 25 mm and is kept airtight.

Since the container 10 is a wide mouth container and particularly a drum-shaped container, the outer electrode 120 may be of simple cylinder-like structure. Since the shoulder of the container is not substantially reduced in diameter, there is no excess space between the container 10 and the outer electrode 120. This enables the vacuum pump to be reduced in capacity and cycle.

Subsequently, a vacuum pump (not shown) is actuated to evacuate the hermitic space around the container 10 through the vacuum pipes 124. As the hermitic space reaches a predetermined degree of vacuum, the process gas is introduced into the hermitic space through the gas inlet pipe 122 to fill it with the process gas. The inner electrode 140 is then supplied with the high-frequency power from the source of high-frequency power 160 through the matching box 150 and electrifying shaft 146. The gas pressure in the hermitic space may be maintained substantially constant by supplying the process gas at a constant rate of flow while evacuating the process gas. At this time, it is preferred that the gas inlet pipe 122 and vacuum pipes 124 are arranged to bring the process gas in uniform contact with the outer wall of the container 10, as shown in FIG. 3.

In such a manner, plasma will be generated in the hermitic space around the container 10 by exciting the process gas with the electric field energy between the outer electrode 120 and the inner electrode 140.

If the process gas is a gas containing carbon atoms, such as acetylene, the plasma will generate carbon ions of plus charge. On the other hand, the inner electrode 140 is self-biased to minus potential. Therefore, the plus carbon ions migrate toward and hit against the outer wall of the container 10 to create an impact energy which binds the carbons together on the outer wall to form a dense DLC film 18. In such a manner, the DLC film 18 is substantially uniformly formed on the body portion 14 and bottom portion 16 of the container 10 to provide gas barrier properties.

However, since the support 142 having its outer wall formed of insulating material is on the inner wall of the flange 12A, the DLC film 18 will not be formed on the outer wall of the flange 12A. Thus, the processing time can substantially be reduced to eliminate any factor that would deform the container 10.

Thereafter, the process gas is exhausted from the hermitic space before a purge gas is charged into the hermitic space up to the atmospheric pressure. The outer electrode 120 is then moved upward. Thus, the container 10 having its outer wall coated with the DLC film 18 can be removed from the machine.

Second Embodiment

Figure 4:
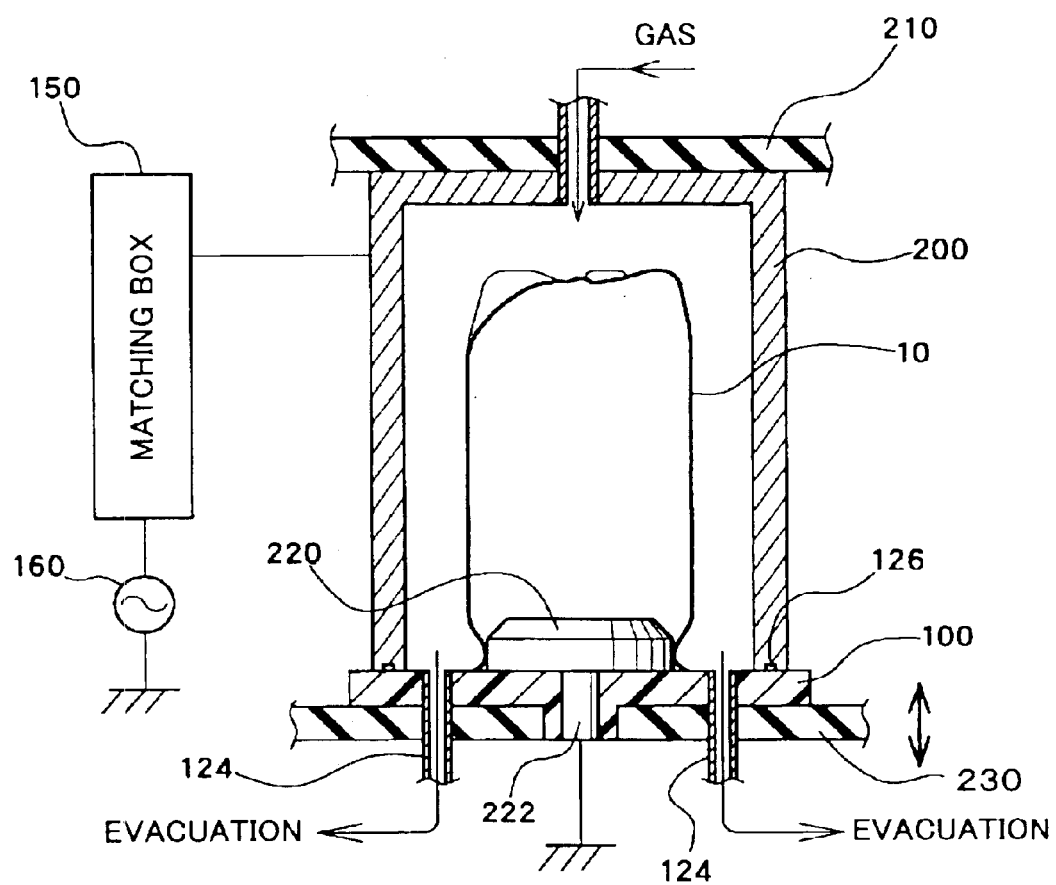
FIG. 4 is a schematic diagram illustrating a machine for making the container of FIG. 1 according to the second embodiment of the present invention.

FIG. 4 shows a machine different from that of FIG. 3. Parts similar in function to those of FIG. 3 are denoted by similar reference numerals and will not further be described.

Referring to FIG. 4, the source of high-frequency power 160 is connected to an external electrode 200 through the matching box 150 while the inner electrode 220 is grounded through an electrifying shaft 222. In such an arrangement, the outer electrode 200 is fixedly mounted-on an upper stationary plate 210 while the base 100 is fixedly mounted on a lower movable plate 230 so that the base 100 can be brought into contact with and separated from the outer electrode 200. The gas inlet pipe 122 is connected to the top center of the outer electrode 200 while the vacuum pipes 124 are connected to the base 100. Thus, the same flow of gas as in FIG. 3 can be realized.

The inner electrode 220 of FIG. 4 holds the container 10 as in FIG. 3, but its length extending into the container 10 is shortened. For example, the inner electrode 220 has its top face located at a position corresponding to the shoulder of the container 10 (i.e., a container portion between the opening portion and the body portion).

The machine of FIG. 4 will not utilize the migration of plus-charged carbon ions toward the side of minus-charged electrode as in FIG. 3, but can form the DLC film 18 on the body portion 14 and bottom portion 16 of the container 10 through carbon ions in a plasma which is excited by the high electric field between the outer electrode 200 and the inner electrode 220.

In this embodiment, the difference between the minimum inside diameter Dmin of the container opening portion 12 and the maximum inside diameter Dmax of the container body portion 14 is equal to or smaller than 20 mm. That is to say, the container 10 is a so-called wide mouth container. On the other hand, the inner electrode 220 has its outside diameter slightly smaller than the minimum inside diameter Dmin of the opening portion 12. This provides a relatively large space in the interior of the container 10. Therefore, an electric field sufficient to excite the plasma in the hermitic space around the container 10 can be provided even though the inner electrode does not extend more deeply into the interior of the container 10 as in FIG. 3.

The flange 12A of the container 10 will not be coated with the DLC film 18 similarly to the container of FIG. 3 since the flange 12A is double-seamed with the metal can cover 20.

Third Embodiment

Figure 5:
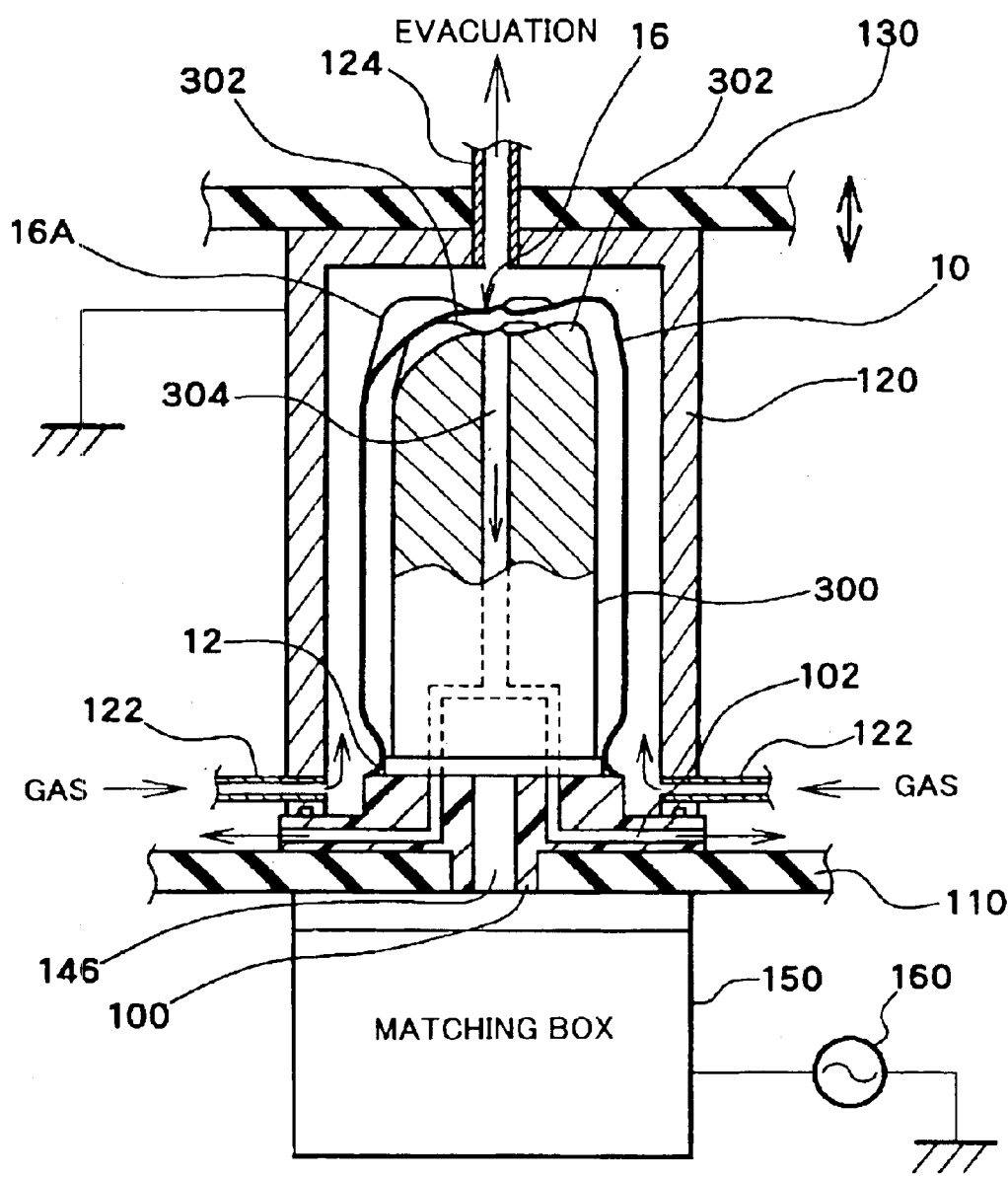
FIG. 5 is a schematic diagram illustrating a machine for making the container of FIG. 1 according to the third embodiment of the present invention.

FIG. 5 shows a modification of the machine shown in FIG. 3. In FIG. 5, the outer electrode 120 has a gas outlet 124 located at a position opposite to the bottom portion 16 of the container 10 and connected to a vacuum pump (not shown). The outer electrode 120 has a plurality of gas inlets 122 for introducing a gas from a gas supply device (not shown) into the hermitic space around the container 10 supported on the base 100 at the opening portion 12 thereof. FIG. 5 shows an inner electrode 300, the top of which includes a plurality of protrusions 302 located at positions corresponding to the respective legs 16A of the container 10. The inner electrode 300 also includes an evacuation passage 304 formed therethrough along the central axis. The evacuation passage 304 communicates with evacuation passages 102 formed through the base 100, these evacuation passages 102 being connected to a vacuum pump (not shown).

In the machine of FIG. 5, the gas introduced through the gas inlets 122 moves upward in a space between the outer wall of the container 10 and the outer electrode 120. As the gas is evacuated through the gas outlet 124, it is converted into plasma which contains carbon ions. These carbon ions are used to form the DLC film 18 on the outer walls of the body portion 14 and bottom portion 16. The flange 12A of the container 10 will not be coated with the DLC film 18 depending on the position of the gas inlets 122.

Since the space between the inner electrode 300 and the inner wall of the container 10 is evacuated through the evacuation passages 102 and 304, any fluid such as air will leak from this space into the processing space. Any excess plasma will not be created in the space between the inner electrode 300 and the inner wall of the container 10. And yet, the container 10 can be attached to the base 100 under vacuum.

Since the top of the inner electrode 100 has the protrusions 302, the DLC film 18 can uniformly be formed on the legs 16A on the bottom portion 16 of the container 10.

Forth Embodiment

Figure 6:
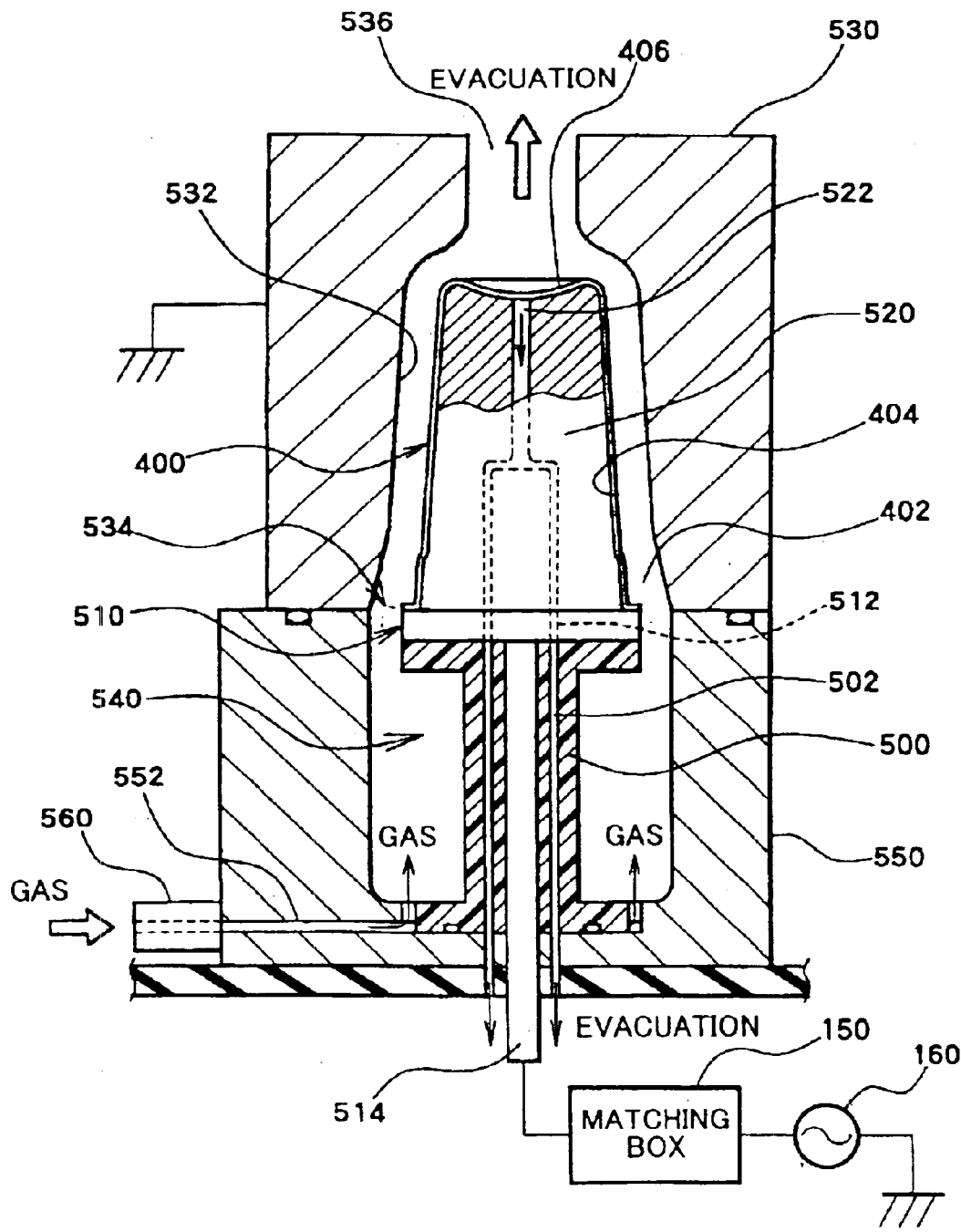
FIG. 6 is a schematic diagram illustrating a machine for making a container different from that of FIG. 1 according to the fourth embodiment of the present invention.

FIG. 6 shows a machine for forming a DLC film on a wide mouth container different from that of FIG. 1. This wide mouth container 400 has an opening portion 402, a body portion 404 and a bottom portion 406. The opening portion 402 of this container 400 has the largest diameter. For example, the diameter of the body portion 404 may decrease toward the bottom portion 406. In other words, the minimum diameter of the opening portion 402 is larger than the maximum diameter of the body portion 404.

The machine of FIG. 6 includes an insulating base 500 on which an exposed electrode 510 and an inner electrode 520 are located. The inner electrode 520 has a configuration similar to the internal shape of the container 400 such that the inner electrode 520 will be substantially in intimate contact with the inner wall of the container 400. In this embodiment, similarly, the inner electrode 520 includes an evacuation passage 522 formed therethrough; the exposed electrode 510 includes evacuation passages 512 formed therethrough; and the base 500 includes evacuation passages 502 formed therethrough. These evacuation passages can be used to evacuate the space between the inner wall of the container 400 and the inner electrode 520.

The exposed electrode 510 is connected to an electrode rod 514 which extends through the base 500. The electrode rod 514 is connected to the source of high-frequency power 160 through the matching box 150.

The outer electrode 530 is grounded and has an internal cavity substantially similar to the outline of the container 400. The bottom portion end of the outer electrode 530 includes a gas inlet 534 while the top thereof includes a gas outlet 536. The gas inlet 534 provides a ring-shaped opening portion around the opening portion 402 of the container 400 by locating the inner electrode 520 at such a processing position as shown in FIG. 6. The diameter of the gas outlet 536 is set to be larger than the difference between the internal and outside diameters of the ring-shaped gas inlet 534.

An enclosing structure 550 for forming a gas introduction chamber 540 around the base 500 is located below the outer electrode 530. The enclosing structure 550 includes gas inlet passages 552 formed therethrough, these gas inlet passages 552 being connected to a gas inlet pipe 560.

The enclosing structure 550 can be separated from the outer electrode 530 together with the base 500, exposed electrode 510 and inner electrode 520. This separation can be carried out by a drive (not shown).

In operation, the enclosing structure 550, together with the base 500, exposed electrode 510 and inner electrode 520, is first moved downward. In such a state, the container 400 is brought into intimate contact with the inner electrode 520. Thereafter, the enclosing structure 550 is moved upward to set such a state as shown in FIG. 6 wherein the outer electrode 530 is hermetically connected to the enclosing structure 550.

Thereafter, the evacuation is performed through the gas outlet 536 to evacuate the gas introduction chamber 540 and the hermitic space around the container 400. As a predetermined degree of vacuum is attained, the aforementioned process gas is introduced into the interior of the machine through the gas inlet pipe 560. At the same time, RF power is supplied from the source of high-frequency power 160 to the exposed electrode 510 and inner electrode 520 through the matching box 150.

The gas introduced into the gas introduction chamber 540 is pre-excited by an electric field formed between the exposed electrode 510 on which the RF power is applied and the grounded enclosing structure 550. Thus, a plasma is generated upstream of the ring-shaped gas inlet 534.

The pre-excited gas is introduced into the hermitic space around the container 400 through the ring-shaped gas inlet 534 substantially at constant velocity. The gas introduced into the hermitic space is further excited to generate plasma by the electric field between the inner electrode 520 and the outer electrode 530.

Such a generation of plasma enables the DLC film 18 to be formed on the outer wall of the container 400. Particularly, the DLC film 18 can also be formed on the opening portion 402 of the container 400 through the plasma which is generated in the gas introduction chamber 540 upstream of the gas inlet 534. Since the flow of gas around the container 400 becomes uniform in the presence of the ring-shaped gas inlet 534, the DLC film 18 can be formed around the container 400 with uniform thickness and property.

The present invention is not limited to the aforementioned embodiments, but may be carried out in any one of various other forms without departing from the scope and spirit of the invention.

Although the process gas used in the aforementioned embodiments has been described as to acetylene, the DLC film 18 can similarly be formed by using any one selected from a group consisting of saturated carbons or hydrogens such as methane, ethane, propane, butane, pentane, hexane, heptane, octane, nonane, decane, undecane, dodecane and eicosane, unsaturated carbons or hydrogens such as ethylene, propylene and methylene acetylene, simple gases of aromatic hydrocarbon such as benzene, xylene and naphthalene and combinations thereof. Similarly, the DLC film 18 can be formed by introducing such a hydrocarbon gas as described above while at the same time introducing a single gas such as hydrogen, nitrogen, oxygen, argon or a combination thereof.

If the container has a plastic cap screwed onto the internally threaded opening portion thereof, the gas barrier properties of the container itself can be improved by forming the DLC film on the opening portion. In such a case, the holding member for holding the opening portion may be used as electrode.

Although FIG. 3 shows the central step 102 on the base 100, the base may be flat while the evacuating pipes may be connected to the base 100 and insulating member 110.

A communicating passage may be provided in the holding member and/or inner electrode such that the spaces inside and outside of the container 10 can be evacuated simultaneously.

Any one of various other forms can be structured by adding or modifying parts in the first to fourth embodiments. For example, the fourth embodiment of FIG. 6 can be applied to such a type of wide mouth container 10 as shown in FIG. 1, rather than the wide mouth container 400 in which the minimum diameter of the opening portion is larger than the maximum diameter of the body portion. In this case, the internal and external electrodes and others may be replaced by any other parts for the wide mouth container 10 shown in FIG. 1. The inner electrodes 140, 220, base 100 and others shown in FIGS. 3 and 4 may include such evacuation passages as shown in FIGS. 5 and 6 such that the space between the container 100 and the inner electrode 140 or 220 can be evacuated.

The fourth embodiment of the present invention can be applied to any one of various containers such as narrow mouth containers other than the wide mouth containers as described. Particularly, a uniform film can be formed on the outer wall of each of various containers if the ring-shaped gas inlet, gas introduction chamber, pre-excitation portion and others are provided. In this case, the film is not restricted to the diamond-like carbon film.

What is claimed is:

1. A machine which makes a gas barrier synthetic resin container by forming a diamond-like carbon film on an outer wall of a wide mouth synthetic resin container which has an opening portion, a body portion followed by the opening portion, and a bottom portion for closing the end of the body portion, the minimum inside diameter of the opening portion being larger than the maximum inside diameter of the body portion, and the machine comprising:

a base which supports the opening portion;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container;

a plasma excitation portion which generates plasma in the ambient space around the container by using the inner and outer electrodes; and a ring-shaped gas inlet which introduces the gas from the gas supply device into the ambient space around the container, the gas inlet extending around the opening portion.

2. The machine which makes a gas barrier synthetic resin container as defined in claim 1, wherein the inner electrode is substantially in contact with an inner wall of the container.

3. The machine which makes a gas barrier synthetic resin container as defined in any of claims 1, wherein the inner electrode has an evacuation section which evacuates air from the space between the inner electrode and an inner wall of the container.

4. The machine which makes a gas barrier synthetic resin container as defined in claim 3, wherein the outer electrode has a gas outlet connected to the vacuum pump in a position facing the bottom portion of the container.

5. The machine which makes a gas barrier synthetic resin container as defined in claim 4, wherein the diameter of the gas outlet is larger than the difference between the inside and outside diameters of the ring-shaped gas inlet.

6. The machine which makes a gas barrier synthetic resin container as defined in claims 3, further comprising:

an enclosing structure forming a gas introduction chamber, disposed at a position upstream from the gas inlet.

7. The machine which makes a gas barrier synthetic resin container as defined in claim 6, further comprising:

a pre-excitation portion which pre-excites the gas in the gas introduction chamber.

8. The machine which makes a gas barrier synthetic resin container as defined in claim 7, wherein the pre-excitation portion comprises:

a pair of electrodes, one of the electrodes being part of the inner electrode externally extending from the container through the opening portion, and the other electrode being one of the outer electrode and the enclosing structure.

9. The machine which makes a gas barrier synthetic resin container as defined in claim 6, further comprising:

a drive which moves the enclosing structure relative to the outer electrode, and also moves the inner electrode relative to the outer electrode through the base, together with the enclosing structure.

10. The machine which makes a gas barrier synthetic resin container as defined in claim 1, wherein the inner electrode comprises:

a support which is disposed within the opening portion and supports the container; and an electrode rod extending upward from the support.

11. The machine which makes a gas barrier synthetic resin container as defined in claim 10, wherein the opening portion is defined by an outwardly extending thin-walled flange to be used for seaming; and wherein an outer surface of the support which supports the flange is formed of an insulating material.

12. The machine which makes a gas barrier synthetic resin container as defined in any of claims 1, wherein the container has a plurality of legs outwardly extending from the bottom portion; and wherein the top of the inner electrode has a plurality of protrusions each of which is disposed at a position facing the corresponding one of the legs.

13. The machine which makes a gas barrier synthetic resin container as defined in claim 1, wherein the distance between an inner wall of the outer electrode and an outer wall of the container body portion is in the range of 10 mm to 25 mm.

14. A gas barrier synthetic resin container made by the machine as defined in claim 1, wherein the outer wall of the container is coated with a diamond-like carbon film.

15. The gas barrier synthetic resin container as defined in claim 14, wherein the opening portion of the container has an outwardly extending thin-walled flange to be used for double-seaming.

16. A gas barrier synthetic resin container filled with contents, which is the gas barrier synthetic resin container as defined in claim 15 filled with contents, wherein a metal cover and the flange are double-seamed onto the container.

17. The gas barrier synthetic resin container filled with contents as defined in claim 16, wherein the flange with which the metal cover is double-seamed onto the container is not coated with a diamond-like carbon film.

18. A machine which makes a gas barrier synthetic resin container by forming a diamond-like carbon film on an outer wall of a wide mouth synthetic resin container which has an opening portion, a body portion including the opening portion, and a bottom portion for closing the end of the body portion, the minimum inside diameter of the opening portion being less than the maximum inside diameter of the body portion, the difference between the diameters is equal to or less than 20 mm, and the machine comprising:

a base which supports the container;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container; and a plasma excitation portion which generates plasma in the ambient space around the container by using the inner and outer electrodes; and a ring-shaped gas inlet which introduces the gas from the gas supply device into the ambient space around the container, the gas inlet extending around the opening portion.

19. A machine which makes a gas barrier synthetic resin container by forming a film on an outer wall of a synthetic resin container which has an opening portion, a body portion including the opening portion, and a bottom portion for closing the end of the body portion, the machine comprising:

a base which supports the container;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container;

a plasma excitation portion which generates plasma in the ambient space around the container by using the inner and outer electrodes; and a ring-shaped gas inlet which introduces the gas from the gas supply device into the ambient space around the container from the side of the opening portion of the container supported on the base.

20. A machine which makes a gas barrier synthetic resin container by forming a diamond-like carbon film on an outer wall of a wide mouth synthetic resin container which has an opening portion, a body portion followed by the opening portion, and a bottom portion for closing the end of the body portion, the minimum inside diameter of the opening portion being larger than the maximum inside diameter of the body portion, and the machine comprising:

a base which supports the opening portion;

an inner electrode extending from the base into the container through the opening portion;

an outer electrode which keeps the ambient space around the container supported on the base airtight;

a vacuum pump which evacuates air from the ambient space around the container;

a gas supply device which supplies a gas including carbon atoms into the ambient space around the container;

a plasma excitation portion which generates plasma in the ambient space around the container by using the inner and outer electrodes; and an enclosing structure forming a gas introduction chamber, disposed at a position upstream from the gas inlet.

21. The machine which makes a gas barrier synthetic resin container as defined in claim 20, further comprising:

a pre-excitation portion which pre-excites the gas in the gas introduction chamber.

22. The machine which makes a gas barrier synthetic resin container as defined in claim 21, wherein the pre-excitation portion comprises:

a pair of electrodes, one of the electrodes being part of the inner electrode externally extending from the container through the opening portion, and the other electrode being one of the outer electrode and the enclosing structure.

23. The machine which makes a gas barrier synthetic resin container as defined in claim 22, further comprising:

a drive which moves the enclosing structure relative to the outer electrode, and also moves the inner electrode relative to the outer electrode through the base, together with the enclosing structure.

* * * * *